United States Patent [19]
Baker

[11] Patent Number: 6,066,963
[45] Date of Patent: May 23, 2000

[54] MOS OUTPUT DRIVER, AND CIRCUIT AND METHOD OF CONTROLLING SAME

[76] Inventor: William G. Baker, 98A Lummus Dr, Starkville, Miss. 39759

[21] Appl. No.: 08/939,196

[22] Filed: Sep. 29, 1997

[51] Int. Cl.[7] .............................................. H03K 19/0175
[52] U.S. Cl. .............................. 326/83; 326/86; 326/121; 326/17
[58] Field of Search ................... 326/83, 86, 57, 326/58, 121, 17, 49, 50

[56] References Cited

U.S. PATENT DOCUMENTS 5,381,055  1/1995  Lai et al. ..................................... 326/27

OTHER PUBLICATIONS

P. Xu, U.S.S.N. 08/635,022, Low Noise 3V/5V CMOS Bias Circuit, Filed Apr. 1, 1996.

*Primary Examiner*—Michael Tokar
*Assistant Examiner*—Anh Q. Tran

[57] ABSTRACT

A circuit and method for providing a fast transitioning output buffer that may be configured to operate using either a 3 volt or 5 volt supply voltage. The pullup behaves similarly to a MOS diode, but the circuit lowers the gate voltage on a pullup while the output is being pulled up. The circuit does not affect the final pullup voltage. As a result, a single PMOS device may be used as a pullup device that does not generally require an increased size to support a high operating voltage.

14 Claims, 3 Drawing Sheets

MOS OUTPUT DRIVER, AND CIRCUIT AND METHOD OF CONTROLLING SAME

FIELD OF THE INVENTION

The present invention relates to output drivers generally and, more particularly, to an output driver using MOS technology that is configured to operate using either a 3 volt or 5 volt supply voltage.

BACKGROUND OF THE INVENTION

For integrated circuits operating at a relatively high supply voltage (e.g., a TTL voltage such as 5 volts), it is advantageous to have an NMOS output pullup driver. The NMOS output driver reduces system power by not pulling the output all the way up to the supply voltage. Integrated circuits operating with a relatively low supply voltage (e.g., 3 volts) typically use CMOS voltage levels and are therefore generally required to pull their outputs up to voltages near the supply. This is usually accomplished using a PMOS pullup transistor.

It is desirable to have a single part that can be programmed using fuses, or some other type of step late in the fabrication process, to configure the part to operate using either 5 volt or 3 volt supply voltages. One implementation may be realized by providing two independent pullup sections. The first pullup would be an NMOS pullup while the second pullup would be a PMOS pullup. The late configuration would configure the appropriate pullup for the desired voltage operation. However, this would require the output section to generally duplicate the pullups which would result in a larger chip.

Implementing a single pullup device for use with both 3 volt and 5 volt input supply voltages may reduce the overall die size. One alternative to such an implementation would be using an NMOS pullup with a boot strapped gate. Another implementation may be a PMOS pullup with an additional circuit to turn off the PMOS pullup after the output has been pulled up to the desired voltage. One way of implementing the PMOS pullup approach is to connect the pullup as a diode for 5 V operation. However, the size of the PMOS pullup is generally (and usually undesirably) determined by the larger 5 volt part rater than the smaller 3 volt part.

SUMMARY OF THE INVENTION

The present invention concerns a circuit and method for providing a fast transitioning output buffer configured for low voltage operation (e.g., a 3 volt supply voltage) with the same output devices as for a high voltage operation (e.g., a 5 volt supply voltage). In one embodiment, the circuit lowers the gate voltage on a P-channel pullup while the output is being pulled up. In another embodiment, the circuit raises the gate voltage on an N-channel pulldown as the output is pulled down. As a result, MOS devices configured for low voltage operation (e.g., 3 volt) may be used as pullup and pulldown devices in a relatively high operating voltage environment (e.g., 5 volts) in the absence of devices configured to operate at the high voltage (e.g., having an increased size relative to a device configured for 3 volt operation).

The objects, features and advantages of the present invention include providing a 5 V output driver that uses the same PMOS pullup and NMOS pulldown as a 3 V output driver, does not require a larger PMOS device to support the 5 volt operation, provides a fast output transition and has a reduced final pullup voltage.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
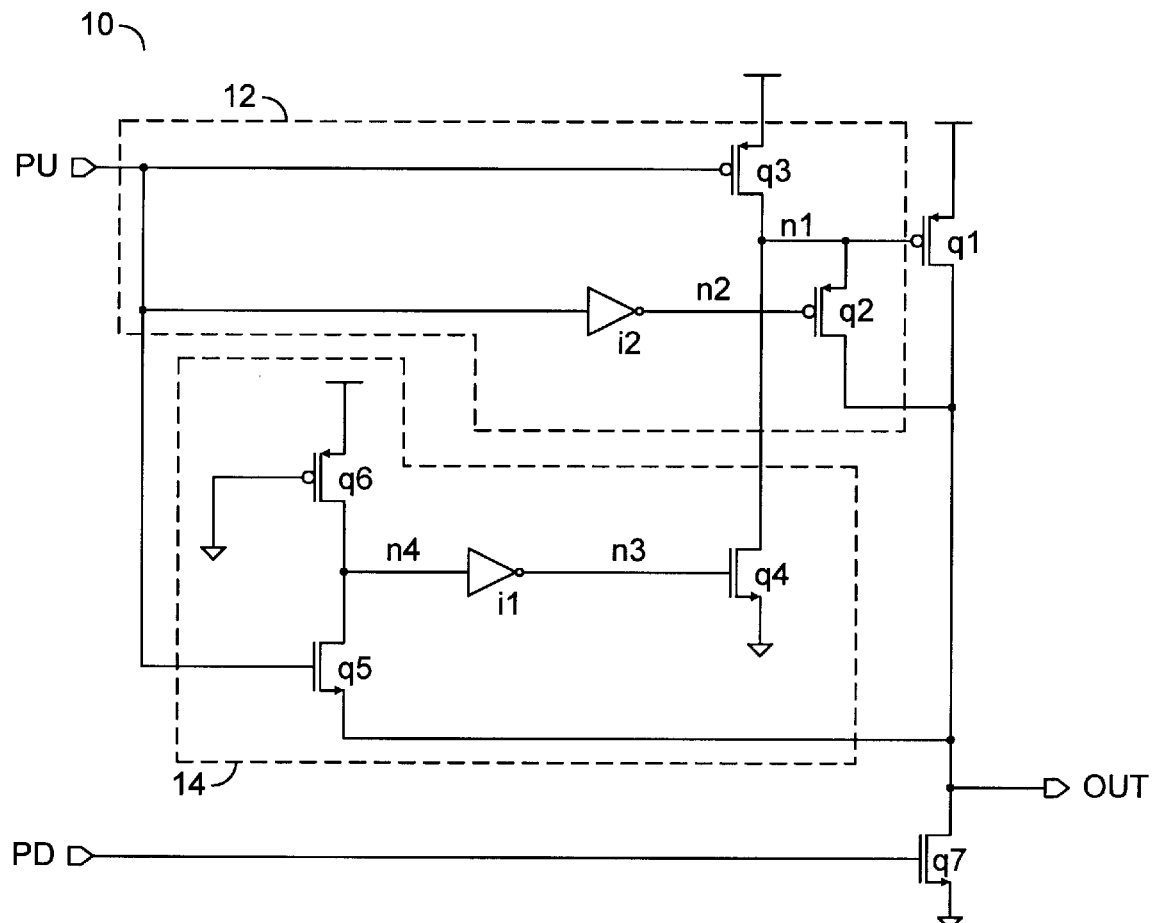
FIG. 1 is a circuit diagram of a preferred embodiment of the present invention.

Referring to FIG. 1, a diagram of a circuit 10 for providing an output driver using a PMOS technology pullup driver transistor that operates using a 5 volt supply voltage is shown in accordance with a preferred embodiment of the present invention. Another example of an output driver that operates using either a 3 volt or 5 volt supply voltage may be found in U.S. application Ser. No. 08/635,022, filed on Apr. 14, 1996, which is hereby incorporated by reference in its entirety. The circuit 10 generally comprises a transistor Q1, a transistor Q2, a transistor Q3, a transistor Q4, a transistor Q5, a transistor Q6, a transistor Q7, an inverter I1 and an inverter I2. The circuit 10 generally has a pullup input PU, a pulldown input PD and an output OUT. The inverter I2, the transistor Q2 and the transistor Q3 generally form an enable/disable section (or circuit) 12. The transistor Q4, the transistor Q5, the transistor Q6 and the inverter I1 generally form an output transition time-decreasing section (or circuit) 14. A disable circuit comprising the transistor Q3 may be configured in parallel with the output transition time-decreasing circuit 14.

The pullup input PU may be presented to a gate of the transistor Q3, a gate of the transistor Q5 and to the inverter I2. The source of the transistors Q1 and Q3 are generally connected to an input supply voltage (not shown). The drain of the transistor Q3 may be connected to the gate of the transistor Q1, the source of the transistor Q2 and the drain of the transistor Q4. The drain of the transistor Q3 is shown generally as a node N1. The output of the inverter I2 may be presented to the gate of the transistor Q2 and is shown generally as a node N2. The sources and drains of each of the transistors may be referred to generally as terminals. The inverter I2 may be implemented directly after the pullup input PU (e.g., outside the disable circuit 12), if a complementary pullup input (e.g., PUB) is used.

The drain of the transistors Q1 and Q2 are generally coupled together with the source of the transistor Q5 and the drain of the transistor Q7 to create the output OUT. A source of the transistor Q6 is also coupled to the input supply voltage. A gate of the transistor Q6 is generally coupled to ground. The supply voltage and ground may be referred to generally as power busses. The drain of the transistor Q6 as well as the source of the transistor Q5 are shown generally as a node N4 that may be presented to the inverter I1. The output of the inverter I1 is generally shown as a node N3 that may be presented to the gate of the transistor Q4. The source of the transistor Q4 is generally coupled to ground. The pulldown input PD is generally coupled to the gate of the transistor Q7 while the source of the transistor Q7 is generally coupled to ground. The transistor Q1 is shown generally as a PMOS type device while the transistor Q4 is shown generally as a NMOS type device. PMOS devices and NMOS devices may be considered to be complementary type devices.

The operation of the circuit 10 can be described generally as either pulling the output OUT to a high state, pulling the output OUT to a low state, or not pulling the output OUT to either state (i.e., a three-state or high impedance state) in response to the pullup input PU and the pulldown input PD. When the output OUT is pulled to a high state, the transistor Q1 is generally configured as a diode having a gate and drain shorted by the transistor Q2. When the output OUT is pulled low by the transistor Q7, the transistor Q1 is generally held in an off state by the transistor Q3. When the output OUT is pulled high, the transistors Q4, Q5, Q6 and the inverter I1 generally speed up the pullup transition by decreasing the voltage present at the gate of the transistor Q1.

When the output OUT is to be pulled from low to high, the pullup input PU is generally taken high, which turns off the transistor Q3, turns on the transistor Q2 and turns on the transistor Q5. When the transistor Q2 is on, the node N1 is generally pulled down to a voltage equal to the ground voltage plus a P-channel threshold. The transistor Q5 generally pulls the node N4 down to a voltage below the threshold voltage of the inverter I1. The transistor Q6 is generally configured as a weak device which allows the transistor Q5 to pull the node N4 below the threshold of the inverter I1. Next, the node N3 rises which generally turns "on" the transistor Q4 which generally pulls the node N1 down to the ground voltage. This generally causes the transistor Q2 to turn off and remain off until the output OUT has risen to a voltage equal to the ground voltage plus a P-channel threshold. As the output OUT is pulled above the P-channel threshold, the transistor Q2 starts to turn on which increases the voltage on the node N1.

The ratio of the drive strengths of the transistors Q2 and Q4 may be adjusted to insure that the increase in the voltage at the node N1 is a slight voltage increase. As the output OUT is pulled up, the transistor Q5 starts to turn off. The ratio of the drive strengths of the transistors Q5 and Q6 as well as the threshold voltage of the inverter I1 create a threshold voltage. Once the threshold voltage is reached, the voltage at the node N3 will begin to fall, which generally turns off the transistor Q4. The voltage at the node N1 rises up to the voltage at the output OUT. As a result, the transistor Q1 is configured as a diode and the output OUT will be pulled up to a voltage equal to the input supply voltage minus a P-channel threshold.

Figure 2:
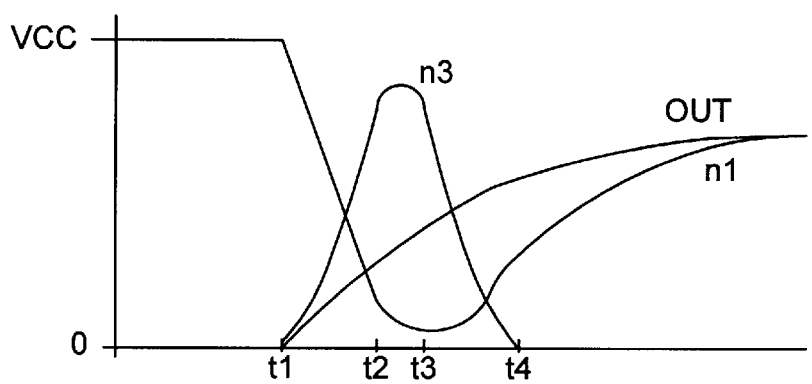
FIG. 2 is a timing diagram of the various nodes of the circuit of FIG. 1.

Referring to FIG. 2, a timing diagram of the node N1, the node N3 and the output OUT is shown. The voltages are shown as generally ranging between a zero voltage level and a supply voltage VCC. The node N1 initially starts at a voltage near the supply voltage VCC. At a time T1, the node N3 begins to rise. At a time T2 the node N3 reaches a maximum voltage that is generally slightly less than the supply voltage VCC. After the time T2, the node N3 begins to fall until it reaches a zero voltage at the time T4. At or near the time T1, the output OUT begins to gradually rise. At the time T3, the node N1 begins to gradually rise.

The transistor Q4 generally pulls the gate of the transistor Q1 down during the initial states of pullup of the output OUT. This gives the transistor Q1 a sufficient drive for a 5 volt operation without the requirement of increasing the size of the transistor Q1 beyond what may be required for a 3 volt operation. The transistors Q5 and Q6, and the inverters I1 and I2, generally control the gate of the transistor Q4. The transistor Q4 is generally only on during the beginning of the pullup (i.e., up to time T4). Once the output OUT has risen sufficiently, the transistor Q4 is generally turned off and allows the transistor Q1 to act as a diode. The transistor Q4 is generally not left on after the time T4 to avoid overshoot on the output OUT. Conversely, if the transistor Q4 turns off too soon, then the drive generally required for a 5 volt operation will not be present.

At the start of a pullup transition, the signal PU is taken high, the transistor Q3 turns off and the transistor Q5 turns on. The output of inverter I2 falls, which turns on the transistor Q2 and generally pulls the node N1 down to the output OUT. If there is a very large load at the output OUT, the node N1 will get pulled down to a P-channel threshold above ground which generally provides a slight pullup on the output OUT by transistor Q1. As the output OUT rises, the node N1 will rise until the output rises to the supply voltage minus the P-channel threshold when the transistor Q1 generally starts turning off. The transistor Q1 starts turning off as the node N1 approaches VCC.

As the pullup input PU rises, the transistor Q5 generally turns on. This generally pulls the node N4 down. The weak load on the node N4 from the transistor Q6 will generally start delivering load current into the output OUT. The current from the node N4 is generally small compared with the main load current, but is generally transitioning in the correct direction for proper operation of the circuit 10. The current from the node N4 is generally pulling the output OUT up. After the transistor Q5 has turned on, the node N4 will generally start to fall. Once it reaches the threshold of the inverter I1, the node N3 will generally rise and it will generally turn on the transistor Q4. Generally, the transistors Q4 and Q2 turn on at about the same time. The transistor Q4 is generally a small device. The output OUT initially responds to the transistor Q2 pulling node N1 down. A capacitance on the node N1 is generally realized due to the gate capacitance of the transistor Q1. The transistor Q2 generally pulls the node N1 down until the transistor Q2 starts turning off because as the node N1 approaches a P-channel threshold above ground (e.g., a P-channel threshold voltage), but the transistor Q4 continues to pull the node N1 low. If the output capacitance is large, then transistor Q4 will generally pull the node N1 all the way to ground, insuring maximum drive from the transistor Q1.

The transistor Q2 is generally larger than the transistor Q4. In one embodiment, the transistor Q2 is generally about 5 times as large as the transistor Q4. As the output rises, the transistor Q2 turns on more. Once the output has risen to the extent that the transistor Q4 is off, the transistor Q1 generally functions as a diode. When the transistor Q4 is off, it generally does not influence the output OUT. Generally, the transistor Q4 is a speed up device while the output OUT is low.

A bleed device may be implemented on the node N1 to help pull the node N1 up to VCC. The bleed device may help eliminate noise on the node N1 that may cause OUT to be pulled up by the transistor Q1. However, the circuit 10 may operate adequately without such a bleed device.

Figure 3:
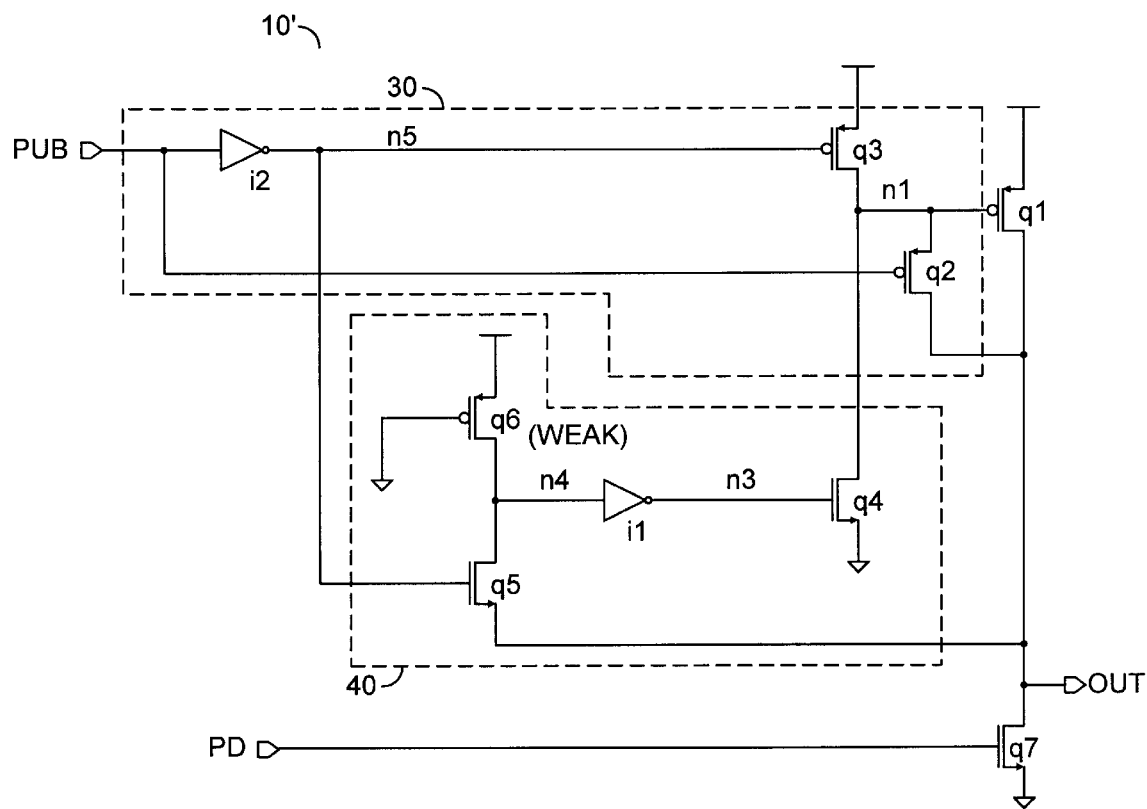
FIG. 3 is a circuit diagram of an alternate embodiment of the present invention.

Referring to FIG. 3, a circuit 10' is shown in accordance with an alternate embodiment of the present invention. The transistors Q1, Q2, Q3 and Q6 are implemented as PMOS transistors while the transistors Q4, Q5 and Q7 are implemented as NMOS transistors. The transistor Q6 is generally configured as a leaker (or load) device, which precharges the node N4 to a voltage that deactivates the transistor Q4 when the transistor Q5 is inactive (i.e., not conducting). A conventional resistive device may replace the transistor Q6. Preferably, the resistivity of transistor Q6 is selected such that the charge on the node N4 is substantially discharged through the transistor Q5 in response to an active pullup control signal PUB. The alternative circuit 10' provides a similar operation as the circuit 10 shown in FIG. 1. Furthermore, one may independently select active low or active high pullup input signals for the enabling circuit 30 and the output transition time-decreasing circuit 40, then match the polarity of the circuit to the active logic level of the input control signal.

Figure 4:
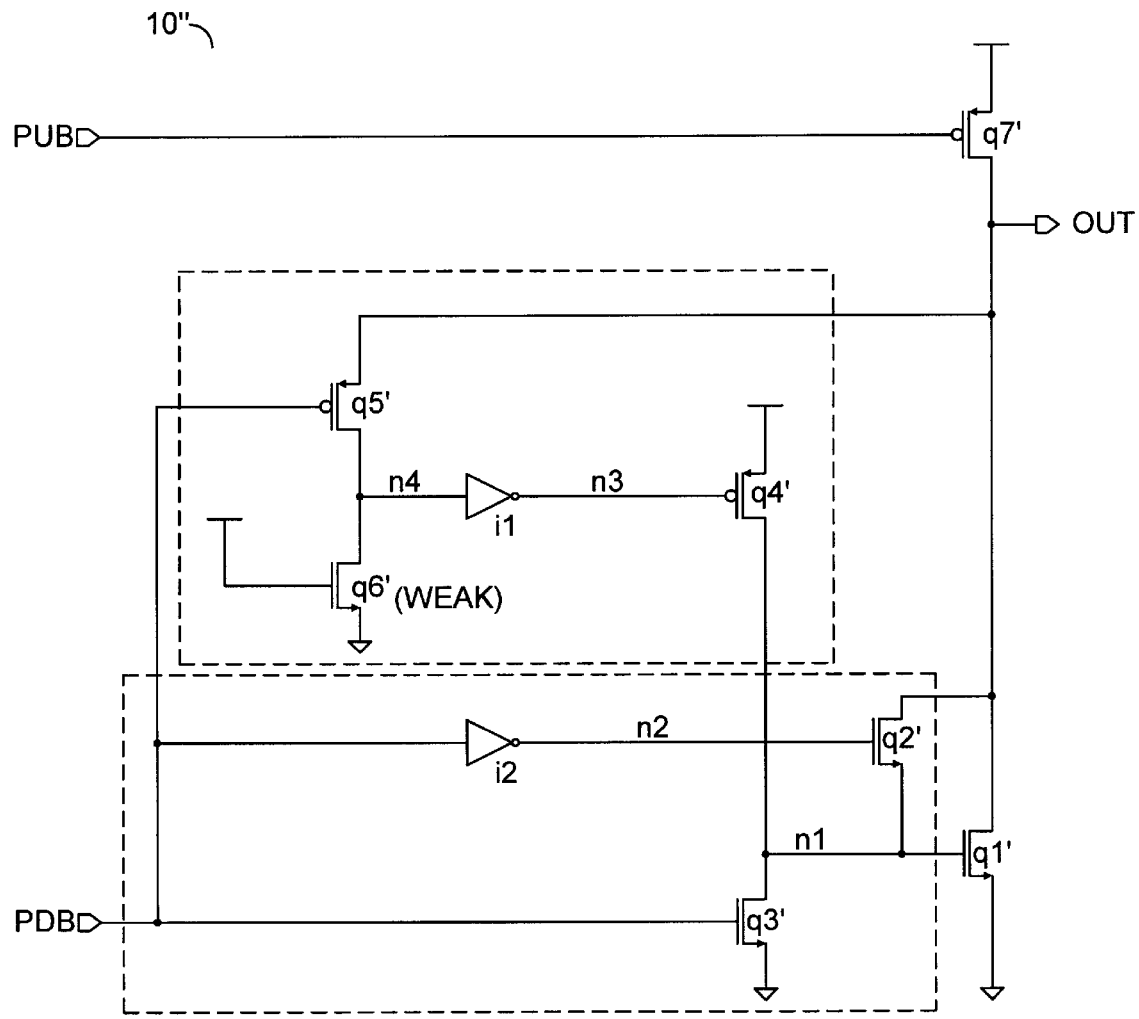
FIG. 4 is a circuit diagram of another alternate embodiment of the present invention.

Referring to FIG. 4, a circuit 10" is shown in accordance with a preferred embodiment of the present invention. The transistors Q2', Q3', Q4', Q5', Q6' and Q7' are shown coupled to the pulldown transistor Q7. As a result, a complementary operation to the circuit 10 and the circuit 10' is generally implemented. The transistors Q4', Q5' and Q7' are shown implemented as PMOS devices, while the transistors Q1', Q2', Q3' and Q6' are shown implemented as NMOS devices.

While the invention has been particularly shown and described with reference to preferred embodiments thereof, it will be understood by those skilled in the art that various changes in form and details may be made without departing from the spirit and scope of the invention.

What is claimed is:

1. A circuit for controlling a MOS driver transistor comprising:

a first circuit configured to enable and/or disable the driver transistor in response to an input signal, wherein said first circuit comprises a first and second transistor of the same type as said driver transistor, said first transistor being coupled between a gate and a source/drain terminal of said driver transistor, said second transistor coupled between said gate of said driver transistor and a first power bus; and a second circuit configured to decrease the output transition time of the driver transistor.

2. The circuit according to claim 1, wherein said second circuit decreases the output transition time in response to said input signal.

3. The circuit according to claim 1 wherein said first circuit is configured in parallel with said second circuit.

4. The circuit according to claim 1, wherein said first circuit comprises a third circuit configured to enable said driver transistor and a fourth circuit configured to disable said driver transistor.

5. The circuit according to claim 1, wherein said second circuit comprises a third transistor of a type complementary to said driver transistor in parallel with said first circuit.

6. The circuit according to claim 5, wherein said second circuit comprises a fourth transistor of said complementary type, a threshold device in series between said third and fourth transistors and a leaker device configured to raise the voltage of a node between said third transistor and said threshold device to a state inactivating said third transistor when said fourth transistor is inactive.

7. An output driver circuit comprising:

a pullup device;

a pulldown device;

a node between the pullup device and the pulldown device; and the circuit for controlling the MOS driver transistor according to claim 1.

8. The circuit according to claim 7 wherein said pullup device comprises a PMOS transistor and said pulldown device comprises an NMOS transistor.

9. A circuit for controlling a MOS driver transistor comprising:

means for enabling said driver transistor in response to an input signal, wherein said means for enabling comprises a first and second transistor of the same type as said driver transistor, said first transistor being coupled between a gate and a source/drain terminal of said driver transistor, said second transistor coupled between said gate of said driver transistor and a first power bus;

means for disabling said driver transistor; and means for decreasing the output transition time of the driver transistor.

10. The circuit according to claim 9, wherein each of said means for disabling and means for decreasing output transition time responsed to said input signal.

11. An output driver circuit comprising:

means for pulling up an output;

means for pulling down said output;

a node connected between said pullup and said pulldown means; and the circuit for controlling the MOS driver according to claim 9.

12. A method for generating an output signal comprising the steps of:

enabling or disabling an output driver transistor in response to an output control signal generated in response to a first and second transistor of the same type as said output driver transistor, said first transistor being coupled between a gate and a source/drain terminal of said output driver transistor, said second transistor coupled between said gate of said output driver transistor and a first power bus; and coupling or decoupling a node to a source/drain terminal of said output driver transistor in response to said output control signal, said node being precharged to a voltage corresponding to a predetermined logic state.

13. The method according to claim 12 further comprising the steps of:

generating said output control signal in response to a signal corresponding to an instruction to generate said output signal in a predetermined logic state.

14. The method according to claim 13, wherein a first state of said output control signal enables and decouples said output driver transistor and a second state of said output control signal disables and couples said output driver transistor.

* * * * *

UNITED STATES PATENT AND TRADEMARK OFFICE
CERTIFICATE OF CORRECTION

PATENT : 6,066,963
DATED : May 23, 2000
INVENTOR(S): William G. Baker

It is certified that error appears in the above-identified patent and that said Letters Patent is hereby corrected as shown below:

On the title page: Item [73] Assignee: Cypress Semiconductor Corp., San Jose, CA--.

Signed and Sealed this

Twenty-fourth Day of April, 2001

Attest:

NICHOLAS P. GODICI

Attesting Officer

Acting Director of the United States Patent and Trademark Office